(12) United States Patent
Ahn et al.

(10) Patent No.: US 11,862,514 B2
(45) Date of Patent: *Jan. 2, 2024

(54) INTEGRATED CIRCUIT DEVICE INCLUDING AIR GAPS AND METHOD OF MANUFACTURING THE SAME

(71) Applicant: Samsung Electronics Co., Ltd., Suwon-si (KR)

(72) Inventors: Sanghoon Ahn, Seongnam-si (KR); Woojin Lee, Suwon-si (KR); Kyuhee Han, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/984,874

(22) Filed: Nov. 10, 2022

(65) Prior Publication Data

US 2023/0072375 A1 Mar. 9, 2023

Related U.S. Application Data

(63) Continuation of application No. 16/872,955, filed on May 12, 2020, now Pat. No. 11,515,201.

(30) Foreign Application Priority Data

Oct. 25, 2019 (KR) .................. 10-2019-0134103

(51) Int. Cl.
*H01L 21/768* (2006.01)
*H01L 23/522* (2006.01)
(Continued)

(52) U.S. Cl.
CPC .... *H01L 21/7682* (2013.01); *H01L 21/76831* (2013.01); *H01L 21/76834* (2013.01);
(Continued)

(58) Field of Classification Search
CPC ........... H01L 21/7682; H01L 21/76831; H01L 21/76834; H01L 21/76877; H01L 23/5226;
(Continued)

(56) References Cited

U.S. PATENT DOCUMENTS 6,365,971 B1 4/2002 Bai
7,030,040 B2 4/2006 Goodner et al.
(Continued)

FOREIGN PATENT DOCUMENTS

JP 2008-277437 A 11/2008
JP 4838190 B2 12/2011
(Continued)

OTHER PUBLICATIONS

Office Action dated Sep. 15, 2021 for corresponding U.S. Appl. No. 16/872,955.

*Primary Examiner* — Patricia D Valenzuela
(74) *Attorney, Agent, or Firm* — Harness, Dickey & Pierce, P.L.C.

(57) ABSTRACT

An integrated circuit device according to the inventive concepts includes lower wiring structures formed on a substrate, an air gap arranged between the lower wiring structures, a capping layer covering an upper surface of the air gap, an etch stop layer conformally covering an upper surfaces of the lower wiring structures and the capping layer and having a protrusion and recess structure, an insulating layer covering the etch stop layer, and an upper wiring structure penetrating the insulating layer and connected to the upper surface of the lower wiring structure not covered with the etch stop layer, wherein the upper wiring structure covers a portion of an upper surface of the capping layer, and
(Continued)

a level of the upper surface of the capping layer is higher than a level of the upper surface of the lower wiring structures.

20 Claims, 21 Drawing Sheets

(51) Int. Cl.
*H01L 23/532* (2006.01)
*H10B 12/00* (2023.01)
*H01L 23/48* (2006.01)
*H01L 23/28* (2006.01)

(52) U.S. Cl.
CPC .... *H01L 21/76877* (2013.01); *H01L 23/5226* (2013.01); *H01L 23/5329* (2013.01); *H01L 21/76895* (2013.01); *H01L 23/28* (2013.01); *H01L 23/48* (2013.01); *H10B 12/482* (2023.02)

(58) Field of Classification Search
CPC ........... H01L 23/5329; H01L 21/76895; H01L 21/76801; H01L 21/76897; H01L 23/5222; H01L 23/53295; H01L 21/76885; H01L 23/5283; H01L 21/76829; H01L 21/76846; H01L 23/28; H01L 23/48; H10B 12/482
See application file for complete search history.

(56) References Cited

U.S. PATENT DOCUMENTS

| | | | |
|---|---|---|---|
| 7,238,604 B2 | 7/2007 | Kloster et al. | |
| 7,589,425 B2 | 9/2009 | Daamen et al. | |
| 8,399,349 B2 | 3/2013 | Vrtis et al. | |
| 9,165,883 B2 | 10/2015 | Vannier | |
| 9,171,781 B2 | 10/2015 | Lee et al. | |
| 9,799,606 B2 | 10/2017 | Ahn et al. | |
| 9,905,456 B1 | 2/2018 | Her et al. | |
| 9,960,110 B2 | 5/2018 | Boyanov | |
| 10,109,519 B2 | 10/2018 | Kao et al. | |
| 11,515,201 B2* | 11/2022 | Ahn | H01L 21/7682 |
| 2002/0163082 A1 | 11/2002 | Lee et al. | |
| 2005/0127514 A1 | 6/2005 | Chen et al. | |
| 2012/0032344 A1 | 2/2012 | Usami | |
| 2013/0049226 A1 | 2/2013 | Liu et al. | |
| 2014/0225251 A1* | 8/2014 | Lee | H01L 23/48 |
| | | | 257/734 |
| 2015/0014759 A1 | 1/2015 | Lee et al. | |
| 2015/0079757 A1* | 3/2015 | Jeon | H01L 21/0332 |
| | | | 438/702 |
| 2016/0181144 A1 | 6/2016 | Nitta et al. | |
| 2017/0047242 A1 | 2/2017 | Sun et al. | |
| 2017/0278796 A1 | 9/2017 | Briggs et al. | |
| 2021/0066120 A1 | 3/2021 | Yang et al. | |

FOREIGN PATENT DOCUMENTS

| | | |
|---|---|---|
| JP | 2012038961 A | 2/2012 |
| KR | 10-2014-0101986 A | 8/2014 |
| KR | 10-2015-0116517 A | 10/2015 |
| WO | WO-2001-037339 A1 | 5/2001 |

* cited by examiner

INTEGRATED CIRCUIT DEVICE INCLUDING AIR GAPS AND METHOD OF MANUFACTURING THE SAME

CROSS-REFERENCE TO RELATED APPLICATION

The present application is a continuation of and claims priority under 35 U.S.C. § 120 to U.S. patent application Ser. No. 16/872,955, filed on May 12, 2020, which claims the benefit of Korean Patent Application No. 10-2019-0134103, filed on Oct. 25, 2019, in the Korean Intellectual Property Office, the disclosure of which is incorporated herein in its entirety by reference.

BACKGROUND

The inventive concepts relate to an integrated circuit device and a method of manufacturing the same, and more particularly, to an integrated circuit device including a multi-layer wiring structure and a method of manufacturing the same.

With the rapid development of the electronics industry and in response to users' requests, electronic devices are reduced in size and/or provided with multiple functions. Thus, down scaling of integrated circuit devices is also making rapid progress, and the line widths and pitches of multi-layer wiring structures included in integrated circuit devices are decreasing. Accordingly, there is an increasing benefit to develop integrated circuit devices having multi-layer wiring structures in which a leakage of current is reduced or suppressed and/or parasitic capacitance is reduced, thus exhibiting improved electrical characteristics and/or reliability.

SUMMARY

The inventive concepts provide an integrated circuit device having improved electrical characteristics and/or reliability and a method of manufacturing the same by reducing or maximally reducing parasitic capacitance by forming an air gap around a wiring on which a via is located.

The inventive concepts also provide an integrated circuit device having improved electrical characteristics and/or reliability and a method of manufacturing the same by reducing or preventing a time dependent dielectric breakdown (TDDB) that may occur in an integrated circuit device by reducing or suppressing a current leakage in a multi-layer wiring structure.

Problems to be solved by the inventive concepts are not limited to the above-mentioned problems, and other problems not mentioned would be clearly understood by those skilled in the art from the disclosure below.

According to an aspect of the inventive concepts, there is provided an integrated circuit device including: lower wiring structures on a substrate, the lower wiring structures including an air gap arranged between the lower wiring structures; a capping layer covering an upper surface of the air gap; an etch stop layer conformally covering upper surfaces of the lower wiring structures and the capping layer and having a protrusion and recess structure; an insulating layer covering the etch stop layer; and an upper wiring structure penetrating the insulating layer and connected to the upper surface of the lower wiring structure not covered with the etch stop layer, wherein the upper wiring structure covers a portion of an upper surface of the capping layer, and a level of the upper surface of the capping layer is higher than a level of the upper surface of the lower wiring structures.

According to another aspect of the inventive concepts, there is provided an integrated circuit device including: lower wiring structures, which are spaced apart in a first direction on an upper surface of a substrate, extend in a second direction perpendicular to the first direction, and are flush with each other in a third direction perpendicular to the upper surface with air gaps between the lower wiring structures and having a first width or a second width which are different from each other in the first direction; capping layers covering an upper surface of the air gaps and having the first width or the second width; an insulating barrier layer surrounding a side surface and lower surface of the air gaps; an etch stop layer conformally covering upper surfaces of the lower wiring structures, a side surface of the insulating barrier layer, an upper surface of the insulating barrier layer, and an upper surface of the capping layers; an insulating layer covering the etch stop layer; and an upper wiring structure penetrating the insulating layer and connected to the upper surface of the lower wiring structure not covered with the etch stop layer, wherein the first width of the air gaps is less than a thickness of the capping layers in the third direction.

According to another aspect of the inventive concepts, there is provided an integrated circuit device including: a first lower wiring structure and a second lower wiring structure on a substrate; with an air gap therebetween; a capping layer covering an upper surface of the air gap; an insulating barrier layer surrounding a side surface of the air gap; an etch stop layer conformally covering an upper surface of the second lower wiring structure, a side surface of the insulating barrier layer, an upper surface of the insulating barrier layer, and an upper surface of the capping layer; an insulating layer covering the etch stop layer; and an upper wiring structure penetrating the insulating layer, connected to an upper surface of the first lower wiring structure, and having a protruding portion covering a portion of the upper surface of the capping layer, wherein a shortest distance between the first lower wiring structure and the second lower wiring structure closest thereto is less than a shortest distance between the protruding portion and the second lower wiring structure closest thereto.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Hereinafter, embodiments of the inventive concepts will be described in detail with reference to the accompanying drawings.

FIGS. 1A to 1D are diagrams illustrating an integrated circuit device according to an embodiment of the inventive concepts.

Figure 1A:
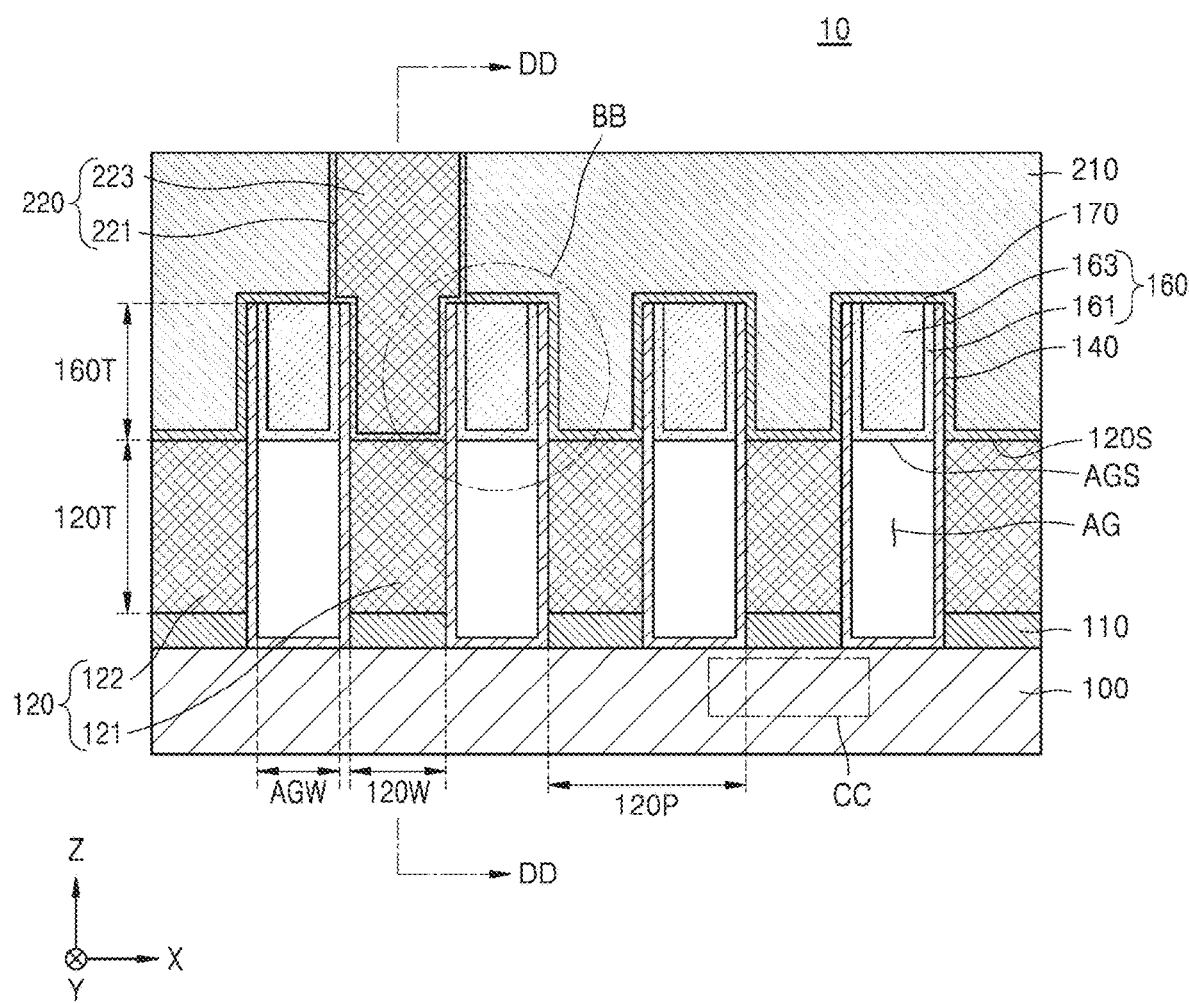
FIGS. 1A to 1D are diagrams illustrating an integrated circuit device according to an embodiment of the inventive concepts.
Figure 1B:
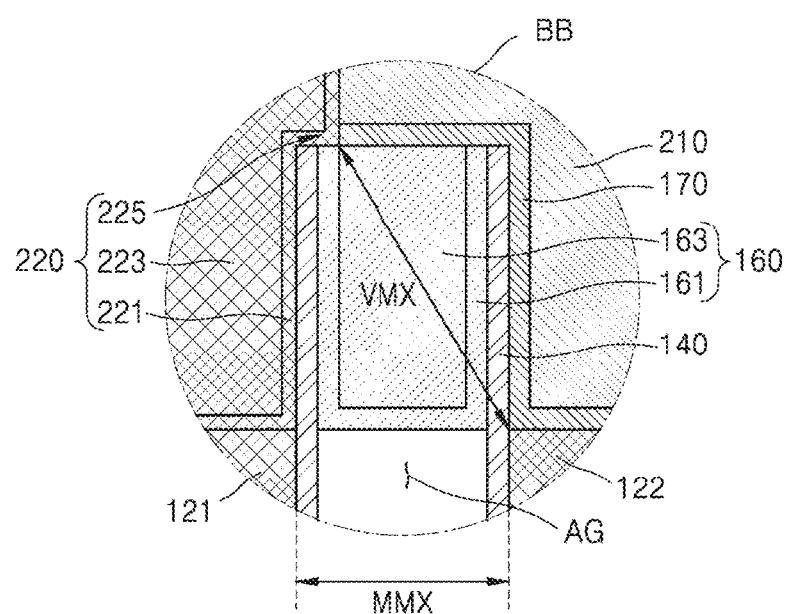
Figure 1C:
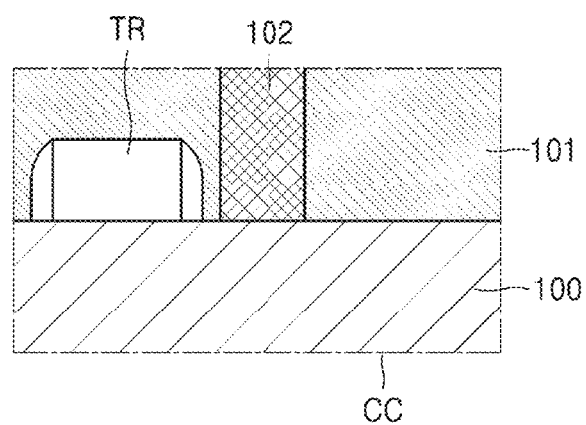
Figure 1D:
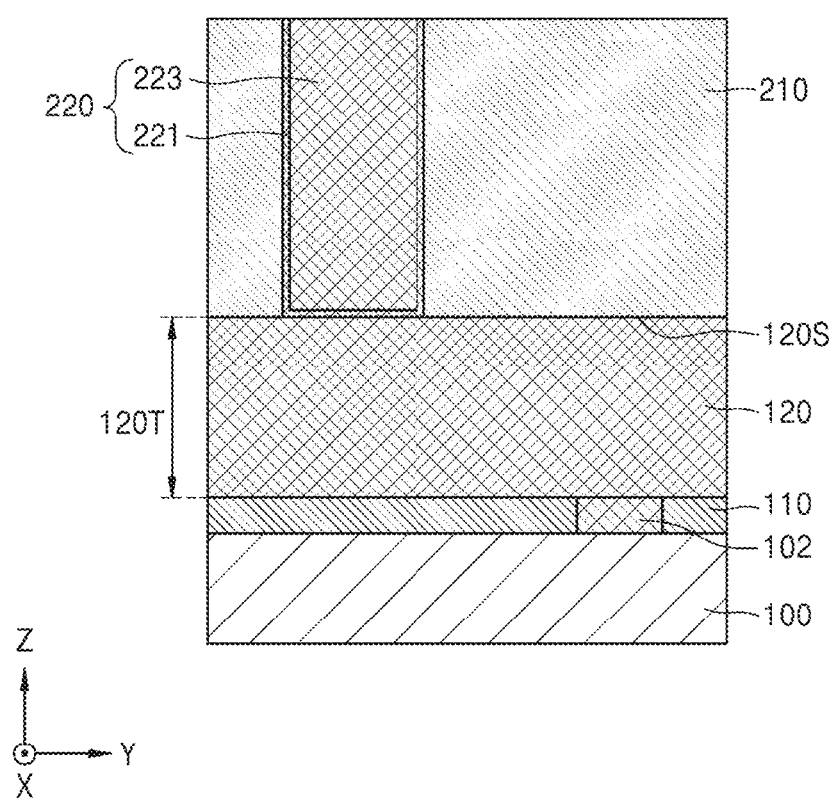

In detail, FIG. 1A is a cross-sectional view of an integrated circuit device 10, FIG. 1B is an enlarged cross-sectional view of the region BB of FIG. 1A, FIG. 1C is an enlarged cross-sectional view of the region CC of FIG. 1A, and FIG. 1D is a cross-sectional view taken along the line DD of FIG. 1A.

Referring to FIGS. 1A to 1D together, the integrated circuit device 10 includes lower wiring structures 120 formed on a substrate 100, an air gap AG arranged between the lower wiring structures 120, a capping layer 160 covering an upper surface of the air gap AG, an etch stop layer 170 having a protrusion and recess structure, an insulating layer 210 covering the etch stop layer 170, and/or an upper wiring structure 220 electrically connected to the lower wiring structure 120.

The substrate 100 may include a wafer including silicon (Si). In some embodiments, the substrate 100 may include a wafer including a semiconductor element such as germanium (Ge) or a compound semiconductor such as silicon carbide (SiC), gallium arsenide (GaAs), indium arsenide (InAs), and indium phosphide (InP). Moreover, the substrate 100 may have a silicon on insulator (SOI) structure. Furthermore, the substrate 100 may have a device area including a transistor TR, an active area, a field area, and the like.

An interlayer dielectric 101 and a contact plug 102 penetrating therethrough may be formed on the substrate 100. In some embodiments, the interlayer dielectric 101 may include a silicon-based insulating material such as silicon oxide, silicon nitride, and silicon oxynitride. The contact plug 102 may be a conductive structure including metal. This metal may include copper (Cu), tungsten (W), aluminum (Al), cobalt (Co), ruthenium (Ru), and the like. In some embodiments, the contact plug 102 may be electrically connected to the active area formed on the substrate 100. For example, the contact plug 102 may be connected to a source/drain area or gate electrode of the transistor TR formed on the substrate 100.

A lower support layer 110 may be arranged on an upper surface of the substrate 100. The lower support layer 110 may include an insulating material. Furthermore, the lower support layer 110 may include a material having a different etch selectivity from that of the lower wiring structure 120. For example, the material of the lower support layer 110 may be selected from among silicon oxide, silicon nitride, silicon oxynitride, and silicon carbide. However, the material of the lower support layer 110 is not limited thereto. In some embodiments, the contact plug 102 may penetrate the lower support layer 110 so as to be electrically connected to the lower wiring structure 120.

The lower wiring structures 120 may be arranged on the lower support layer 110. On the upper surface of the substrate 100, the lower wiring structures 120 may be spaced apart in a first direction (X direction), may extend in a second direction (Y direction) perpendicular to the first direction (X direction), and may be substantially flush with each other in a third direction (Z direction) perpendicular to the upper surface of the substrate 100. The lower wiring structures 120 may be spaced an equal pitch 120P apart in the first direction (X direction). That is, the plurality of lower wiring structures 120 may have the same width 120W, and the plurality of air gaps AG corresponding to a gap between adjacent lower wiring structures of the lower wiring structures 120 may be formed to have the same width AGW. However, embodiments are not limited thereto.

The lower wiring structures 120 may be a conductive structure including metal. For example, the lower wiring structures 120 may include copper (Cu), tungsten (W), aluminum (Al), cobalt (Co), ruthenium (Ru), or a combination thereof. The lower wiring structures 120 may be electrically connected to the contact plug 102, and the lower wiring structures 120 may be electrically connected to the upper wiring structure 220.

In some embodiments, the lower wiring structures 120 may include a first lower wiring structure 121 electrically connected to the upper wiring structure 220 and a second lower wiring structure 122 not electrically connected to the upper wiring structure 220. However, this division is merely for convenience, and thus the second lower wiring structure 122 may also be electrically connected to the upper wiring 220 in another area not illustrated in the drawings.

The air gap AG may be arranged between the lower wiring structures 120. The air gap AG may include air having a relatively low dielectric constant. That is, since the air gap AG which includes air having a relatively low dielectric constant is formed around the lower wiring structures 120, parasitic capacitance between the lower wiring structures 120 may be reduced and/or crosstalk between the lower wiring structures 120 may be reduced.

As a space occupied by the air gap AG increases, the parasitic capacitance and/or crosstalk between the lower wiring structures 120 may further be reduced. Therefore, in some embodiments, a level of an upper surface AGS of the air gap AG may be substantially the same as a level of an upper surface 120S of the lower wiring structure 120.

The air gap AG may be arranged so as to be completely surrounded by an insulating material. That is, the air gap AG may be sealed to have a space that is completely independent of the lower wiring structure 120 by an insulating barrier layer 140 surrounding a side surface and lower surface of the air gap AG and the capping layer 160 covering the upper surface AGS of the air gap AG. The insulating barrier layer 140 and the capping layer 160 may include different materials. Alternatively, the insulating barrier layer 140 and the capping layer 160 may include substantially the same materials, but may have different densities.

The upper surface AGS of the air gap AG is covered with the capping layer 160, and the upper surface 120S of the lower wiring structure 120 is not covered with the capping layer 160. In other words, the capping layer 160 may be selectively arranged only on the upper surface AGS of the air gap AG.

The insulating barrier layer 140 may be arranged so as to surround the side surface and lower surface of the air gap AG. That is, the insulating barrier layer 140 may be conformally formed along the upper surface of the substrate 100, a side surface of the lower support layer 110, a side surface of the lower wiring structure 120, and a side surface of the capping layer 160. The insulating barrier layer 140 may not only partition a space in which the air gap AG is formed but also reduce or prevent diffusion of a metal material included in the lower wiring structure 120 by being formed on the side surface of the lower wiring structure 120.

In some embodiments, the insulating barrier layer 140 may include a material selected from among silicon oxide, silicon nitride, silicon oxynitride, and silicon carbide. In other embodiments, the insulating barrier layer 140 may include a material selected from among high density plasma (HDP) oxide, tetra ethyl ortho silicate (TEOS), plasma enhanced-TEOS (PE-TEOS), undoped silicate glass (USG), phospho silicate glass (PSG), boro silicate glass (BSG), boro phospho silicate glass (BPSG), fluoride silicate glass (FSG), spin on glass (SOG), and tonen silazene (TOSZ).

The capping layer 160 may be arranged so as to cover the upper surface AGS of the air gap AG. The capping layer 160 may include a first capping layer 161 which conformally covers a portion of a side surface of the insulating barrier layer 140 and the upper surface AGS of the air gap AG and a second capping layer 163 which fills the first capping layer 161.

The first capping layer 161 and the second capping layer 163 may include different materials. Alternatively, the first capping layer 161 and the second capping layer 163 may include substantially the same materials, but may have different densities. Alternatively, the first capping layer 161 and the second capping layer 163 may include the same materials, but may be formed using different methods.

In some embodiments, the capping layer 160 may include a material having a density that allows carbon (C) to pass through. This configuration is for providing a space through which carbon (C) that is a major material of a second sacrificial layer 150 (see FIG. 6D) may be smoothly discharged during a process of removing the second sacrificial layer 150 (see FIG. 6D) to form the air gap AG.

A relationship between the capping layer 160 and the lower wiring structure 120 is described as below. The lower wiring structure 120 may have a first thickness 120T, and the capping layer 160 may have a second thickness 160T that is less than the first thickness 120T. Furthermore, the level of the upper surface of the lower wiring structure 120 may be lower than the level of the upper surface of the capping layer 160. That is, the lower wiring structure 120 and the capping layer 160 may be formed as a protrusion and recess structure having a height difference.

The etch stop layer 170 may be arranged so as to conformally cover the upper surface 120S of the lower wiring structure 120, the side surface of the capping layer 160, and the upper surface of the capping layer 160. That is, the etch stop layer 170 may be formed to have a protrusion and recess structure. The etch stop layer 170 may include a material having a different etch selectivity from that of the insulating layer 210. Furthermore, the material of the etch stop layer 170 may have a dielectric constant that is larger than that of the material of the insulating layer 210. To satisfy such conditions, the material of the etch stop layer 170 may include a material including aluminum (Al), for example, aluminum oxide ($Al_xO_y$), aluminum nitride ($Al_xN_y$), aluminum oxynitride ($Al_xO_yN_z$), or any one selected from among zirconium oxide ($Zr_xO_y$) and hafnium oxide ($Hf_xO_y$). However, the material of the etch stop layer 170 is not limited thereto.

The insulating layer 210 may be arranged on the etch stop layer 170. A lower surface of the insulating layer 210 may be arranged so as to conformally cover an upper surface of the etch stop layer 170. That is, the lower surface of the insulating layer 210 may form a protrusion and recess structure having an opposite phase to that of the protrusion and recess structure formed by the etch stop layer 170.

In some embodiments, the insulating layer 210 may include a silicon-based insulating material. For example, the insulating layer 210 may include a material such as plasma enhanced oxide (PEOX), TEOS, boro TEOS (B-TEOS), phosphorous TEOS (P-TEOS), boro phospho TESO (BP-TEOS), BSG, PSG, BPSG, and the like. In other embodiments, the insulating layer 210 may include a dielectric layer having a low dielectric constant of from about 2.2 to about 3.0, for example, a SiOC layer or SiCOH layer. However, the material of the insulating layer 210 is not limited thereto.

The upper wiring structure 220 may penetrate the insulating layer 210 so as to be electrically connected to the lower wiring structure 120. The upper wiring structure 220 may include a metal layer 223 and a conductive barrier layer 221 surrounding the metal layer 223. The metal layer 223 may include copper (Cu), tungsten (W), aluminum (Al), cobalt (Co), ruthenium (Ru), or a combination thereof. Furthermore, the conductive barrier layer 221 may include tantalum (Ta), tantalum nitride (TaN), titanium (Ti), titanium nitride (TiN), or a combination thereof. The capping layer 160 and the etch stop layer 170 may not be formed on the upper surface 120S of the lower wiring structure 120 connected to the upper wiring structure 220.

In some embodiments, the upper wiring structure 220 may include an upper structure and a lower structure. The upper structure may be a wiring line (not shown) extending in a direction perpendicular to the lower wiring structure 120, and the lower structure may be a via arranged at a position at which the wiring line intersects with the lower wiring structure 120. For convenience, only the lower structure (e.g., the via) of the upper wiring structure 220 is illustrated in the drawings. That is, the lower wiring structure 120 may correspond to a first-layer metal wiring (layer M1 of an integrated circuit), the wiring line may correspond to a second-layer metal wiring (layer M2 of the integrated circuit), and the lower structure may correspond to a conductive via which electrically connects between the first-layer and second-layer metal wirings.

In some embodiments, the upper wiring structure 220 may be formed as a stair structure including a protruding portion 225 contacting a portion of the upper surface of the capping layer 160, a side surface of the etch stop layer 170, and an upper surface of the insulating barrier layer 140. Furthermore, in a side cross-sectional view, the etch stop layer 170 may be provided in plurality such that the etch stop layers 170 are spaced apart with the upper wiring structure 220 therebetween, and side surfaces of the upper wiring structure 220 respectively contact side surfaces of the etch stop layers 170 neighboring each other.

A relationship between the upper wiring structure 220 and the lower wiring structure 120 is described as below. A shortest distance between the first lower wiring structure 121 and the second lower wiring structure 122 that is closest thereto is defined as a first shortest distance MMX. Furthermore, a shortest distance between the protruding portion 225, at which the upper wiring structure 220 covers the upper surface of the capping layer 160, and the second lower wiring structure 122 that is closest thereto is defined as a second shortest distance VMX. In this case, the first shortest distance MMX may be less than the second shortest distance VMX. This may result from a design in which the width of the air gap AG in the first direction (X direction) is less than the thickness 160T of the capping layer 160 in the third direction (Z direction).

In general, with regard to an integrated circuit device including an ultra-micro device, when a lithography process is performed, a process margin of a lower wiring structure and an upper wiring structure is reduced, possibly causing difficulty in securing reliability. To resolve this issue, a fully aligned via (FAV) process has been proposed. The FAV process requires a process of forming a protrusion and recess structure by relatively recessing an upper surface of a lower wiring structure relative to a peripheral structure and a process of forming an etch stop layer on the formed protrusion and recess structure. These processes make it more difficult to form an air gap between adjacent lower wiring structures of lower wiring structures.

To resolve this issue, the integrated circuit device 10 according to inventive concepts may allow the FAV process to be relatively easily used while forming the air gap AG between the lower wiring structures 120, by forming the air gap AG using a sacrificial layer and forming the capping layer 160 having a predetermined (or alternatively, desired) thickness or more on the upper surface AGS of the air gap AG. Accordingly, the integrated circuit device 10 may have one or more of the following advantages.

Since the air gap AG which includes air having a low dielectric constant is formed between the lower wiring structures 120, parasitic capacitance between the lower wiring structures 120 may be reduced and/or crosstalk between the lower wiring structures 120 may be reduced. In addition, since the air gap AG is also formed around the first lower wiring structure 121 on which a via is located, reduction of the parasitic capacitance may be increased or maximized.

Next, since a current leakage in a multi-layer wiring structure may be suppressed by the capping layer 160, a time dependent dielectric breakdown (TDDB) of the integrated circuit device 10 may be reduced or prevented. Furthermore, in a situation in which a line width and pitch of the lower wiring structure 120 are scaled down, the capping layer 160 is formed thick enough to secure a separation by a predetermined (or alternatively, desired) distance between the upper wiring structure 220 and the lower wiring structure 120. That is, when performing a lithography process for forming the upper wiring structure 220, a possibility of occurrence of a short circuit between the upper wiring structure 220 and the neighboring lower wiring structure 120 may be remarkably reduced even if unexpected misalignment occurs due to an insufficient process margin.

As a result, the integrated circuit device 10 according to the inventive concepts may have improved electrical characteristics and/or reliability.

Figure 2:
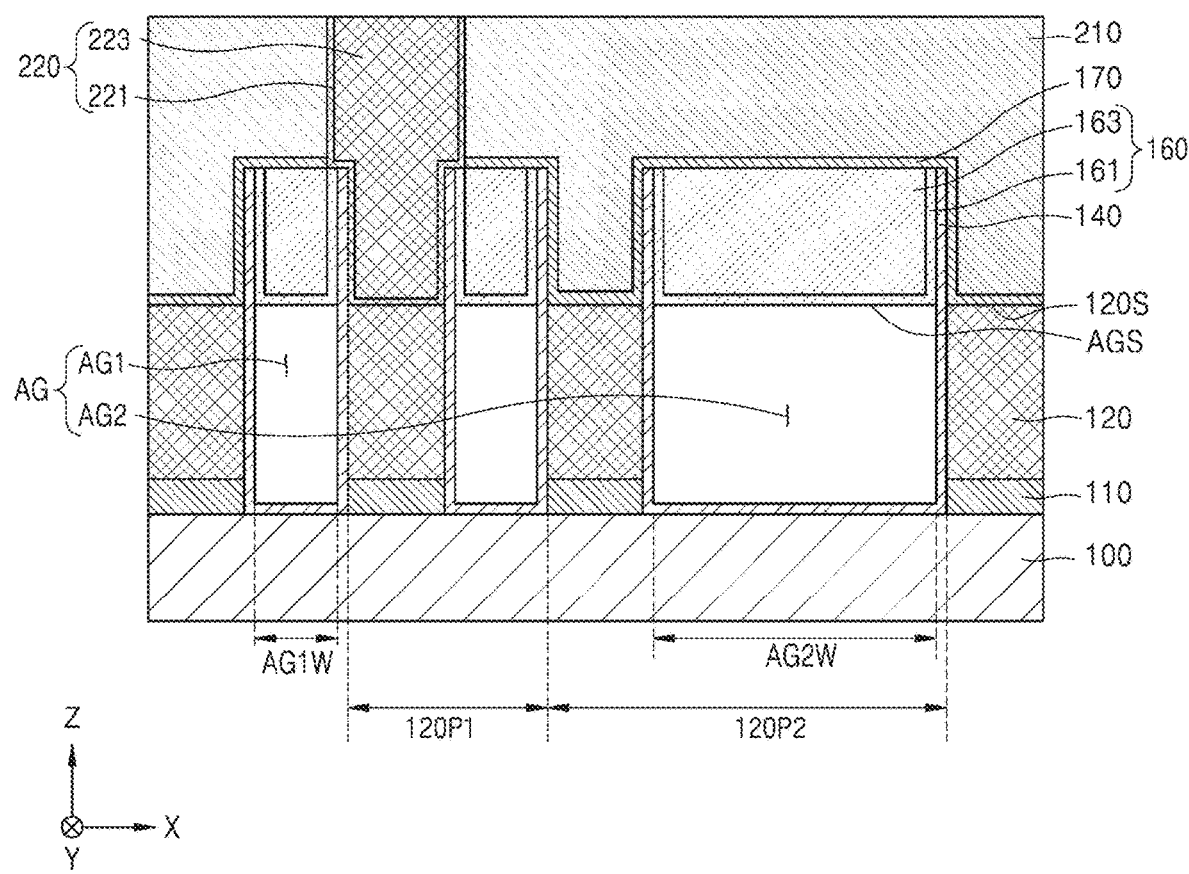
FIGS. 2 to 4 are cross-sectional views illustrating an integrated circuit device according to an embodiment of the inventive concepts.
Figure 3:
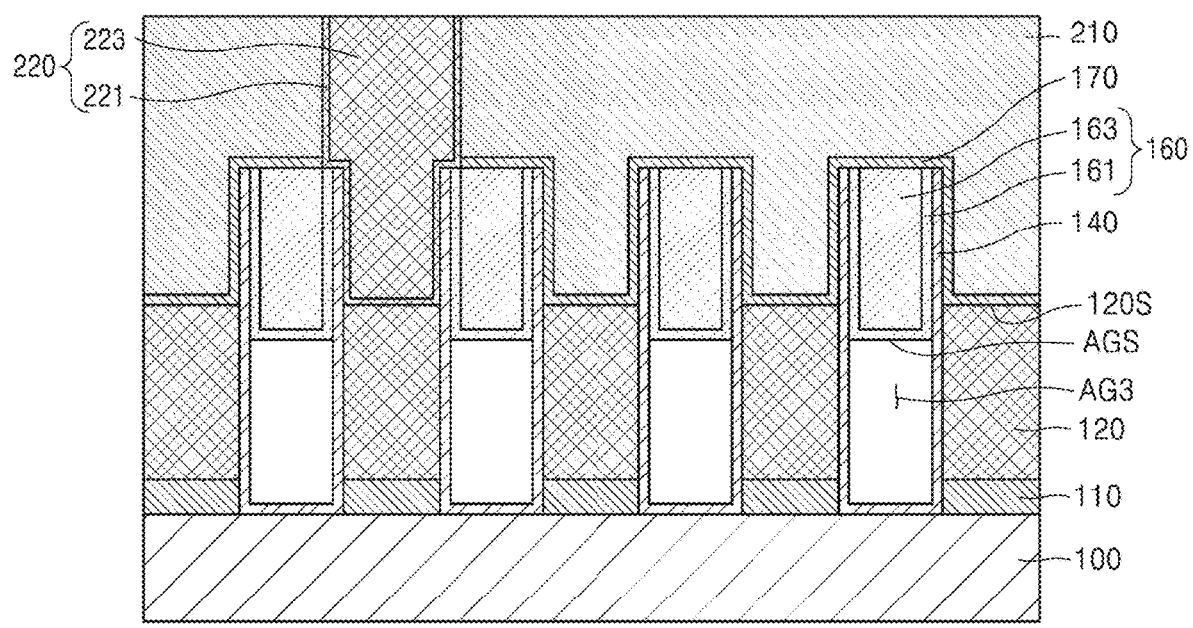
Figure 4:
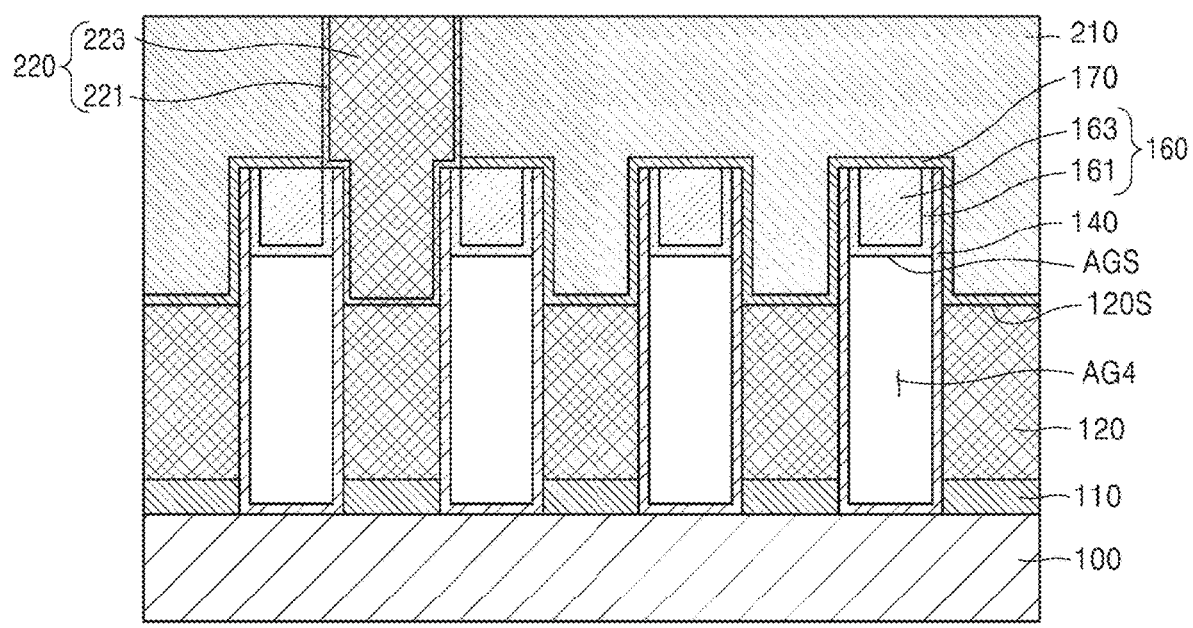

FIGS. 2 to 4 are cross-sectional views illustrating an integrated circuit device according to an embodiment of the inventive concepts.

Most of the components of the integrated circuit devices 20, 30, and 40 described below and materials of the components are substantially the same as or similar to those described above with reference to FIGS. 1A to 1D. Thus, for convenience, the following descriptions are focused on differences between the integrated circuit device 10 (see FIG. 1A) described above and integrated circuit devices 20, 30, and 40.

Referring to FIG. 2, the integrated circuit device 20 includes lower wiring structures 120 formed on a substrate 100 and having different pitches, air gaps AG arranged between the lower wiring structures 120 and having different widths, capping layers 160 covering upper surfaces of the air gaps AG and having different widths, an etch stop layer 170 having a protrusion and recess structure, an insulating layer 210 covering the etch stop layer 170, and an upper wiring structure 220 electrically connected to the lower wiring structure 120.

The lower wiring structures 120 may be arranged on the lower support layer 110. On the upper surface of the substrate 100, the lower wiring structures 120 may be spaced apart in a first direction (X direction), may extend in a second direction (Y direction) perpendicular to the first direction (X direction), and may be substantially flush with each other in a third direction (Z direction) perpendicular to the upper surface of the substrate 100. The lower wiring structures 120 may be spaced a first pitch 120P1 or a second pitch 120P2 apart in the first direction (X direction). The second pitch 120P2 may be greater than the first pitch 120P1. That is, the plurality of lower wiring structures 120 may have the same width 120W, and the plurality of air gaps AG corresponding to a gap between adjacent lower wiring structures of the lower wiring structures 120 may be formed to have a first width AG1W or a second width AG2W which are different from each other. However, embodiments are not limited thereto.

As a space occupied by the air gaps AG increases, the parasitic capacitance and crosstalk between the lower wiring structures 120 may be further reduced. Thus, the air gaps AG may include a first air gap AG1 having the first width AG1W and a second air gap AG2 having the second width AG2W, which is larger than the first width AG1W. The air gaps AG may have a rectangular cross-section.

The capping layers 160 may be arranged so as to cover the upper surface AGS of the air gaps AG. The capping layers 160 may include a first capping layer 161, which conformally covers a portion of a side surface of the insulating barrier layer 140 and the upper surface AGS of the air gap AG, and a second capping layer 163, which fills the first capping layer 161. The capping layers 160 may have substantially the same width as the air gaps AG. That is, the width of the capping layer 160 covering the upper surface AGS of the first air gap AG1 may be the same as the first width AG1W of the first air gap AG1, and the width of the capping layer 160 covering the upper surface AGS of the second air gap AG2 may be the same as the second width AG2W of the second air gap AG2.

As a result, since the air gaps AG may also be formed between the lower wiring structures 120 having different pitches (multiple pitches) in the integrated circuit device 20 according to the inventive concepts, the integrated circuit device 20 may have improved electrical characteristics and/or reliability.

Referring to FIG. 3, the integrated circuit device 30 includes lower wiring structures 120 formed on a substrate 100, air gaps AG3 arranged between the lower wiring structures 120 and having an upper surface lower than an upper surfaces of the lower wiring structures 120, capping layers 160 covering the upper surfaces of the air gaps AG3, an etch stop layer 170 having a protrusion and recess structure, an insulating layer 210 covering the etch stop layer 170, and an upper wiring structure 220 electrically connected to the lower wiring structure 120.

The air gaps AG3 may be arranged between the lower wiring structures 120. Since the air gaps AG3, which include air having a low dielectric constant are formed around the lower wiring structures 120, parasitic capacitance between the lower wiring structures 120 may be reduced and/or crosstalk between the lower wiring structures 120 may be reduced.

As a space occupied by the air gaps AG3 increases, the parasitic capacitance and crosstalk between the lower wiring structures 120 may be further reduced. However, in this case, since structural stability may decrease, the space occupied by the air gaps AG3 may be adjusted considering the relationships with other components. Therefore, in some embodiments, the level of the upper surface AGS of the air gap AG3 may be formed lower than the level of the upper surface 120S of the lower wiring structure 120. The air gaps AG3 may have a rectangular cross-section.

A relationship between the capping layer 160 and the lower wiring structure 120 is described as below. The level of the upper surface of the lower wiring structure 120 may be lower than the level of the upper surface of the capping layer 160. Furthermore, the level of the upper surface of the lower wiring structure 120 may be higher than the level of the lower surface of the capping layer 160. That is, the side surface of the lower wiring structure 120 and the side surface of the capping layer 160 may have areas facing each other.

As a result, since the air gaps AG3 having structural stability may be formed between the lower wiring structures 120 in the integrated circuit device 30 according to the inventive concepts, the integrated circuit device 30 may have improved electrical characteristics and/or reliability.

Referring to FIG. 4, the integrated circuit device 40 includes lower wiring structures 120 formed on a substrate 100, air gaps AG4 arranged between the lower wiring structures 120 and having an upper surface higher than an upper surfaces of the lower wiring structures 120, capping layers 160 covering the upper surfaces of the air gaps AG4, an etch stop layer 170 having a protrusion and recess structure, an insulating layer 210 covering the etch stop layer 170, and an upper wiring structure 220 electrically connected to the lower wiring structure 120.

The air gaps AG4 may be arranged between the lower wiring structures 120. Since the air gaps AG4, which include air having a relatively low dielectric constant are formed around the lower wiring structures 120, parasitic capacitance between the lower wiring structures 120 may be reduced and/or crosstalk between the lower wiring structures 120 may be reduced.

As a space occupied by the air gaps AG4 increases, the parasitic capacitance and crosstalk between the lower wiring structures 120 may further reduce. Therefore, in some embodiments, the level of the upper surface AGS of the air gap AG4 may be formed higher than the level of the upper surface 120S of the lower wiring structure 120. The air gaps AG4 may have a rectangular cross-section.

A relationship between the capping layer 160 and the lower wiring structure 120 is described as below. The level of the upper surface of the lower wiring structure 120 may be lower than the level of the upper surface of the capping layer 160. Furthermore, the level of the upper surface of the lower wiring structure 120 may be lower than the level of the lower surface of the capping layer 160. That is, the side surface of the lower wiring structure 120 and the side surface of the capping layer 160 may not have areas facing each other.

As a result, since a space occupied by the air gaps AG4 may be relatively large in the integrated circuit device 40 according to the inventive concepts, reduction of parasitic capacitance may be increased or maximized, thus improving electrical characteristics and/or reliability.

Figure 5:
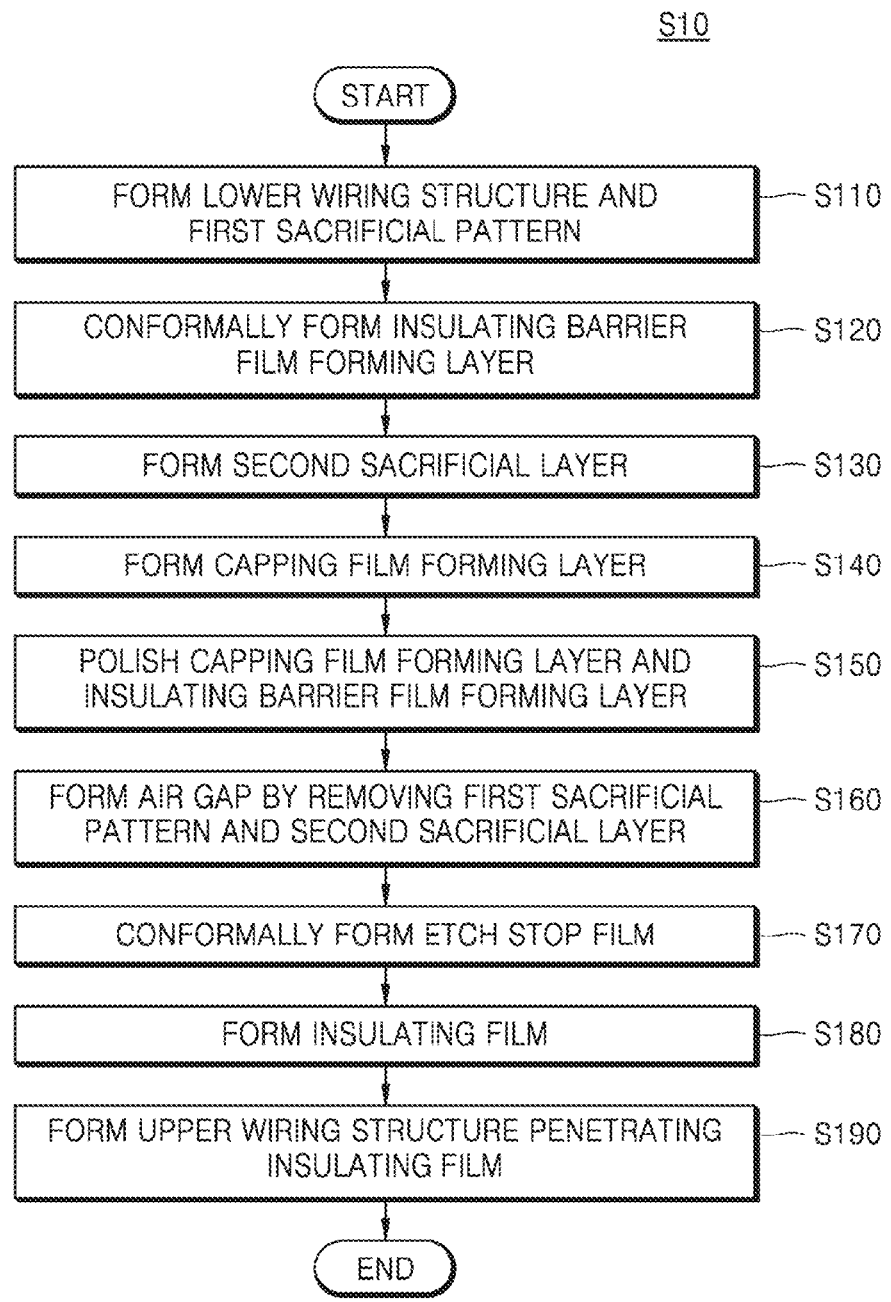
FIG. 5 is a flowchart illustrating a method of manufacturing an integrated circuit device according to an embodiment of the inventive concepts.

FIG. 5 is a block diagram illustrating a method of manufacturing an integrated circuit device according to an embodiment of the inventive concepts.

Referring to FIG. 5, a method of manufacturing an integrated circuit device (S10) includes a first process of forming a lower wiring structure and a first sacrificial pattern (S110), a second process of conformally forming an insulating barrier layer forming layer (S120), a third process of forming a second sacrificial layer (S130), a fourth process of forming a capping layer forming layer (S140), a fifth process of polishing the capping layer forming layer and the insulating barrier layer forming layer (S150), a sixth process of forming an air gap by removing the first sacrificial pattern and the second sacrificial layer (S160), a seventh process of conformally forming an etch stop layer (S170), an eighth process of forming an insulating layer (S180), and a ninth process of forming an upper wiring structure penetrating the insulating layer (S190).

The method of manufacturing an integrated circuit device (S10) may include the above processes S110 to S190. In the case where some embodiments are differently implementable, particular processes may be performed in a different sequence from that described herein. For example, two processes described as being performed successively may be performed simultaneously, or may be performed in a reverse sequence to that described herein.

Technical features related to the first to ninth processes S110 to S190 will be described in detail with reference to FIGS. 6A to 6L.

FIGS. 6A to 6L are cross-sectional views illustrating, according to a sequence of processes, a method of manufacturing an integrated circuit device according an embodiment of the inventive concepts.

Figure 6A:
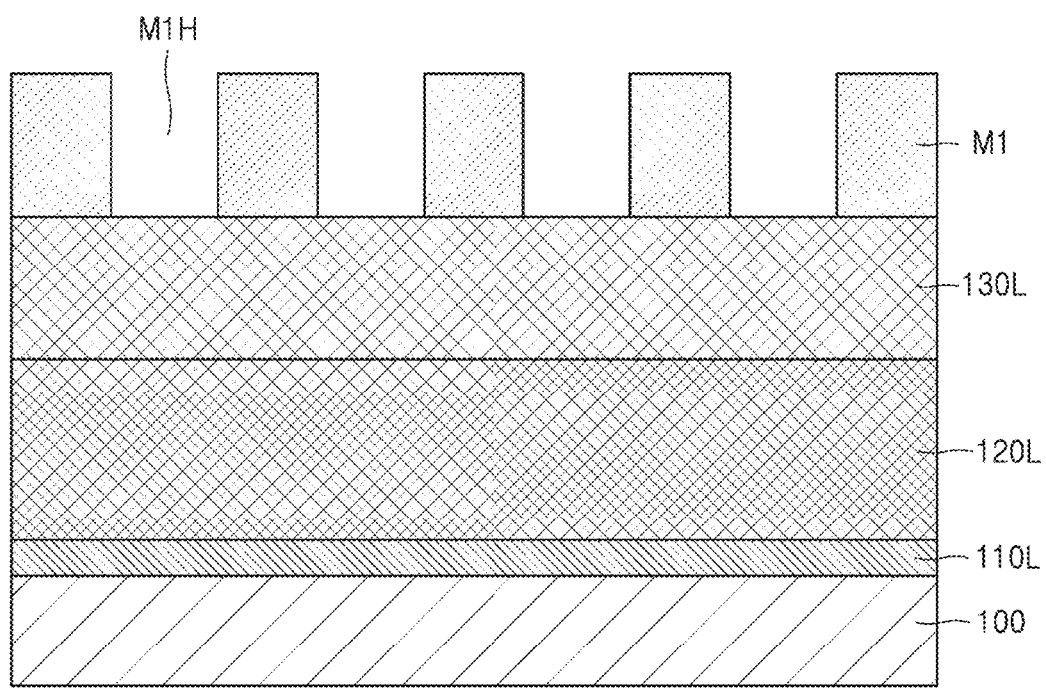
FIGS. 6A to 6L are cross-sectional views illustrating, according to a sequence of processes, a method of manufacturing an integrated circuit device according an embodiment of the inventive concepts.

Referring to FIG. 6A, a lower support layer forming layer 110L, a lower wiring structure forming layer 120L, a first sacrificial layer 130L, and a first mask pattern M1 are sequentially formed on a substrate 100.

The lower support layer forming layer 110L may be formed on the substrate 100. The lower support layer forming layer 110L may include a material having a different etch selectivity from that of the lower wiring structure forming layer 120L. For example, the material of the lower support layer forming layer 110L may be selected from among silicon oxide, silicon nitride, silicon oxynitride, and silicon carbide.

The lower wiring structure forming layer 120L may be formed on the lower support layer forming layer 110L. The lower wiring structure forming layer 120L may include copper (Cu), tungsten (W), aluminum (Al), cobalt (Co), ruthenium (Ru), or a combination thereof.

The first sacrificial layer 130L may be formed on the lower wiring structure forming layer 120L. A material of the first sacrificial layer 130L may include an insulating material. For example, a material such as BPSG, SOG, PSG, TEOS, PE-TEOS, or the like may be used in the first sacrificial layer 130L.

The first mask pattern M1 is formed on the first sacrificial layer 130L through a lithography process. The first mask pattern M1 may be photoresist or a hardmask. When the air gap AG (see FIG. 6H) is formed by the first mask pattern M1, a first open area M1H may be defined. Furthermore, an anti-reflective coating (ARC) (not shown) may be formed on the first sacrificial layer 130L.

Figure 6B:
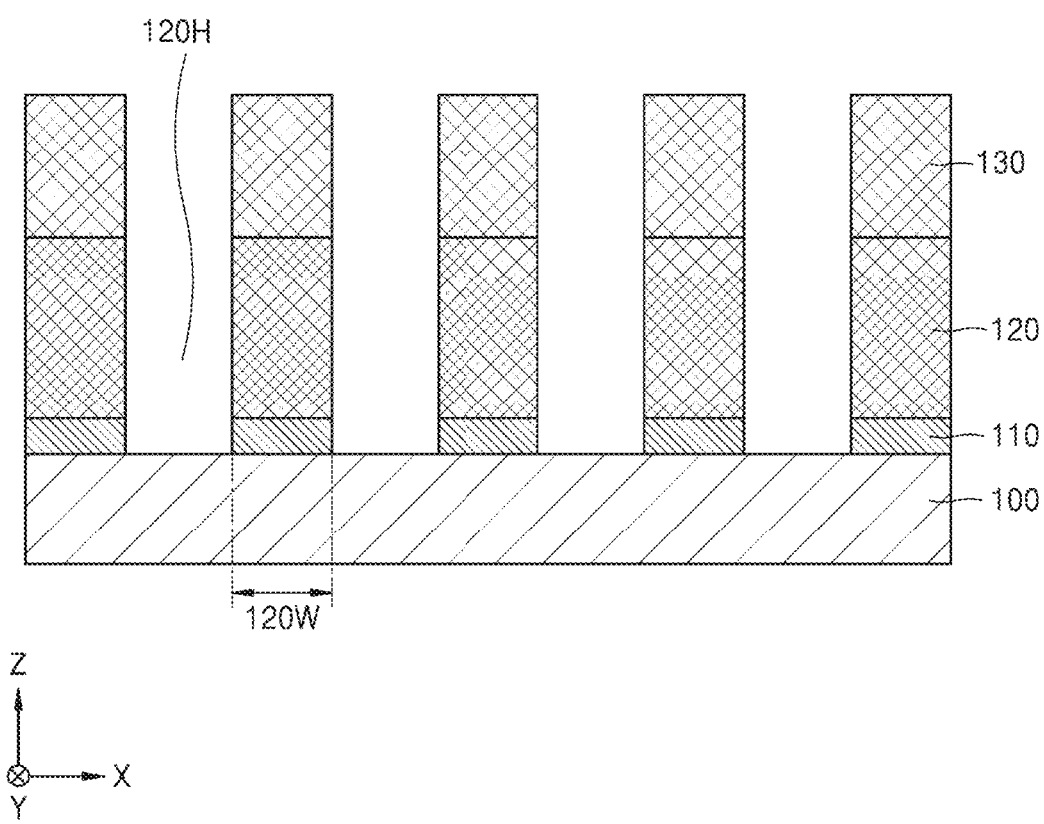

Referring to FIG. 6B, the first sacrificial layer 130L (see FIG. 6A), the lower wiring structure forming layer 120L (see FIG. 6A), and the lower support layer forming layer 110L (see FIG. 6A) are sequentially etched using the first mask pattern M1 (see FIG. 6A) as an etching mask, and the first mask pattern M1 (see FIG. 6A) is removed.

Through the etching process, a plurality of first holes 120H may be formed, and the upper surface of the substrate 100 may be exposed through the first holes 120H. Moreover, through the etching process, the first sacrificial layer 130L (see FIG. 6A) becomes the first sacrificial pattern 130, the lower wiring structure forming layer 120L (see FIG. 6A) becomes the lower wiring structure 120, and the lower support layer forming layer 110L (see FIG. 6A) becomes the lower support layer 110. In some embodiments, the plurality of lower wiring structures 120 may have the same width 120W.

In the case where the etching process is a dry etching process, the plurality of first holes 120H may be tapered so that a lower line width thereof is less than an upper line width thereof. However, for convenience, the first holes 120H are illustrated as being vertically straight in the drawings.

Figure 6C:
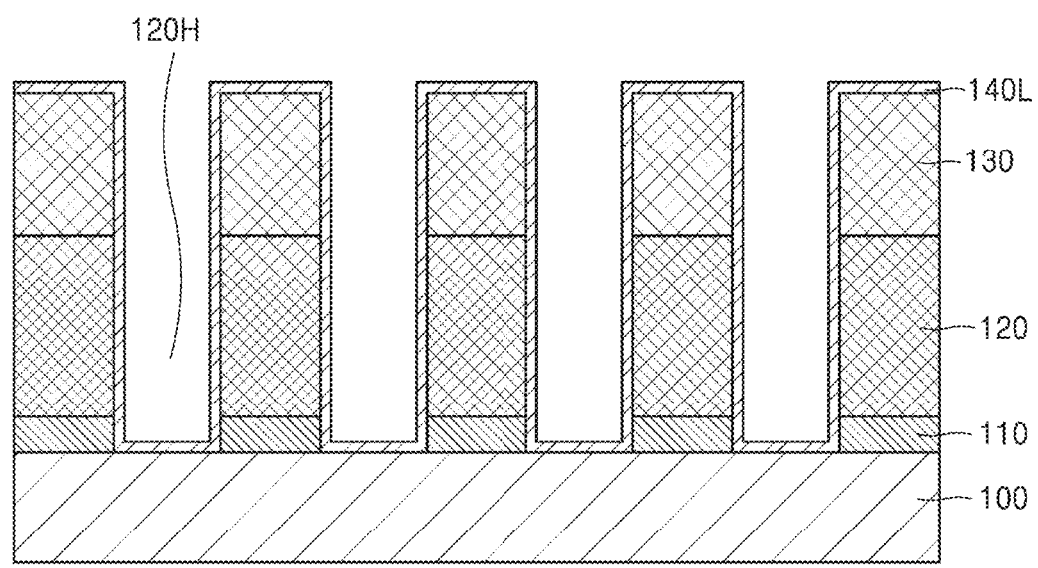

Referring to FIG. 6C, an insulating barrier layer forming layer 140L is conformally formed on a whole surface of a resultant structure of the etching process.

The insulating barrier layer forming layer 140L may be conformally formed along the upper surface of the substrate 100, a side surface of the lower support layer 110, a side surface of the lower wiring structure 120, a side surface of the first sacrificial pattern 130, and an upper surface of the first sacrificial pattern 130. Therefore, the insulating barrier layer forming layer 140L may prevent diffusion of a metal material included in the lower wiring structure 120.

The insulating barrier layer forming layer 140L may include a material selected from among silicon oxide, silicon nitride, silicon oxynitride, and silicon carbide. Alternatively, the insulating barrier layer forming layer 140L may include a material selected from among HDP oxide, TEOS, PE-TEOS, USG, PSG, BSG, BPSG, FSG, SOG, and TOSZ.

The insulating barrier layer forming layer 140L may be formed through chemical vapor deposition (CVD) or atomic layer deposition (ALD).

Figure 6D:
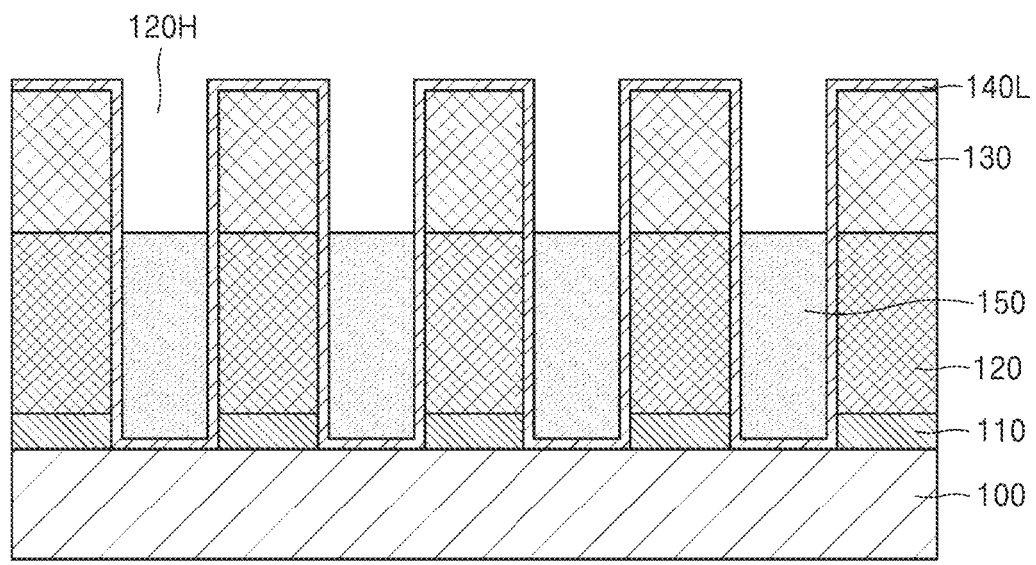

Referring to FIG. 6D, the second sacrificial layer 150, which partially fills each of the plurality of first holes 120H, is formed.

The second sacrificial layer 150 may be formed as a carbon-containing layer. The carbon-containing layer may be a spin on hardmask (SOH) or amorphous carbon layer (ACL). In some embodiments, the carbon-containing layer may be a heat eliminable polymer (HELP) removable through a thermal process. However, the material of the second sacrificial layer 150 is not limited thereto.

A spin coating or chemical vapor deposition process may be used to form the second sacrificial layer 150. Examples of processes for forming the second sacrificial layer 150 are described below. The second sacrificial layer 150, which fully fills each of the plurality of first holes 120H, is formed. Next, an etching process may be performed by recessing an upper surface of the second sacrificial layer 150 so that the level of the upper surface of the lower wiring structure 120 is substantially the same as the level of the upper surface of the second sacrificial layer 150. Accordingly, the second sacrificial layer 150, which partially fills each of the plurality of first holes 120H, is formed.

In other embodiments, the level of the upper surface of the second sacrificial layer 150 may be different from that illustrated in the drawings. That is, the level of the upper surface of the second sacrificial layer 150 may be higher or lower than the level of the upper surface of the lower wiring structure 120.

Figure 6E:
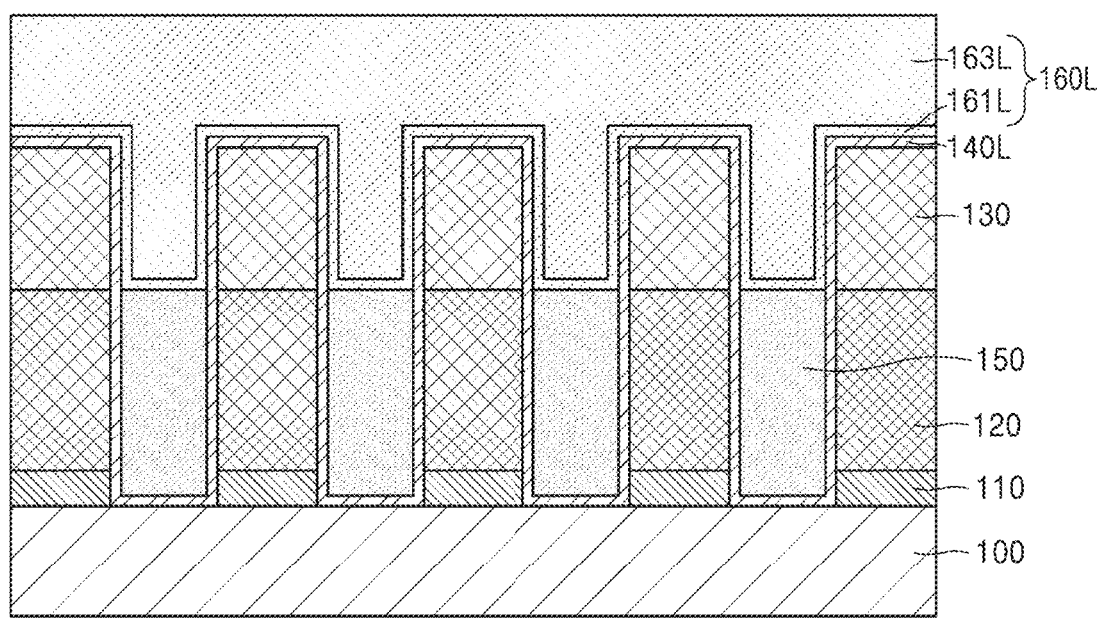

Referring to FIG. 6E, a capping layer forming layer 160L is formed on an exposed upper surface of the second sacrificial layer 150 and the insulating barrier layer forming layer 140L.

The capping layer forming layer 160L may include a first capping layer forming layer 161L and a second capping layer forming layer 163L. In more detail, the first capping layer forming layer 161L is conformally formed on the upper surface of the second sacrificial layer 150, a side surface of the insulating barrier layer forming layer 140L, and an upper surface of the insulating barrier layer forming layer 140L, and the second capping layer forming layer 163L is formed on the first capping layer forming layer 161L.

The first capping layer forming layer 161L and the second capping layer forming layer 163L may include different materials. Alternatively, the first capping layer forming layer 161L and the second capping layer forming layer 163L may include substantially the same materials, but may have different densities.

Alternatively, the first capping layer forming layer 161L and the second capping layer forming layer 163L may include the same materials, but may be formed using different methods. For example, the first capping layer forming layer 161L may be formed through atomic layer deposition, whereas the second capping layer forming layer 163L may be formed through chemical vapor deposition. However, forming methods are not limited thereto.

Figure 6F:
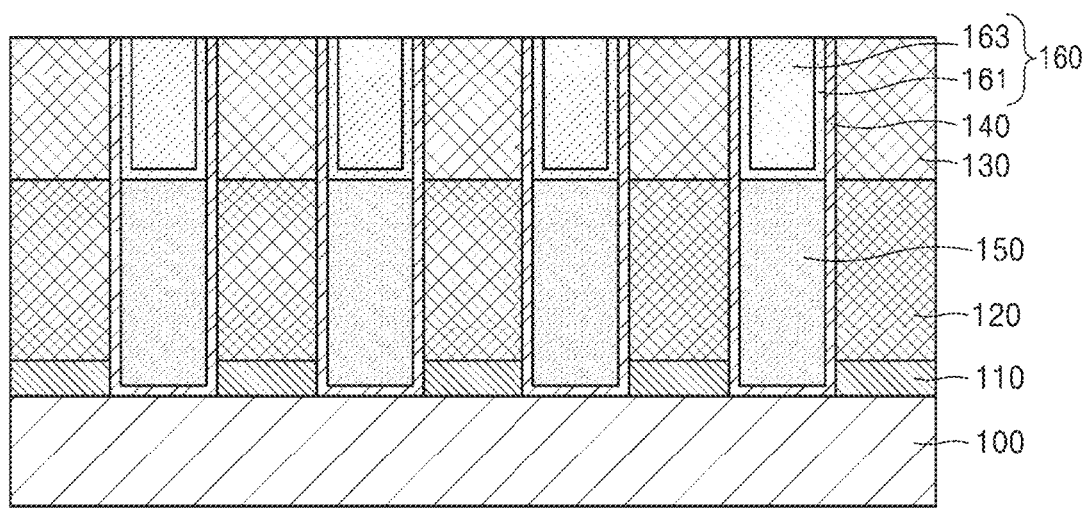

Referring to FIG. 6F, the capping layer forming layer 160L (see FIG. 6E) and the insulating barrier layer forming layer 140L (see FIG. 6E) are etched so that the upper surface of the first sacrificial pattern 130 is exposed.

This etching process (or polishing process) may be a chemical mechanical polishing (CMP) process or an etch-back process.

Through the etching process, the upper surface of the first sacrificial pattern 130 is completely exposed. Moreover, through the etching process, the insulating barrier layer forming layer 140L (see FIG. 6E) becomes the insulating barrier layer 140, and the capping layer forming layer 160L (see FIG. 6E) becomes the capping layer 160.

Furthermore, through the etching process, the second capping layer 163 remains only in the first capping layer 161. As a result, the capping layer 160 may be formed only on the upper surface of the second sacrificial layer 150.

Figure 6G:
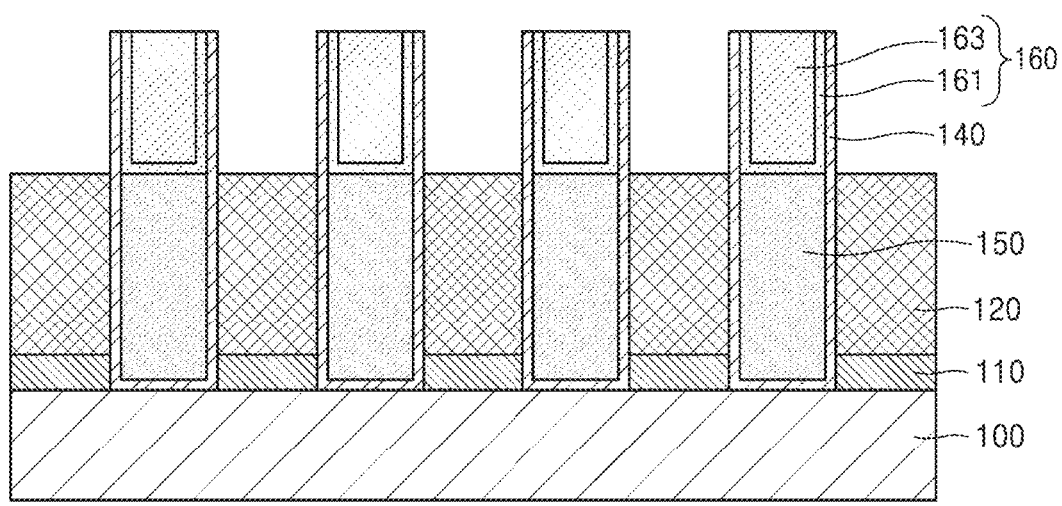

Referring to FIG. 6G, the upper surface of the lower wiring structure 120 is exposed by completely removing the first sacrificial pattern 130 (see FIG. 6F).

An etching process may vary according to a constituent material of the first sacrificial pattern 130 (see FIG. 6F). For example, when the first sacrificial pattern 130 (see FIG. 6F) is silicon oxide or silicon nitride, the first sacrificial pattern 130 (see FIG. 6F) may be removed through dry etching.

During a process of removing the first sacrificial pattern 130 (see FIG. 6F), as a thickness proportion occupied by the first sacrificial pattern 130 (see FIG. 6F) and a density of the constituent material thereof increase, influence of the removing process on other components may increase. Therefore, removal of the first sacrificial pattern 130 (see FIG. 6F) may be performed under a condition in which influence of the removal on the lower wiring structure 120 and the insulating barrier layer 140 is suppressed.

Figure 6H:
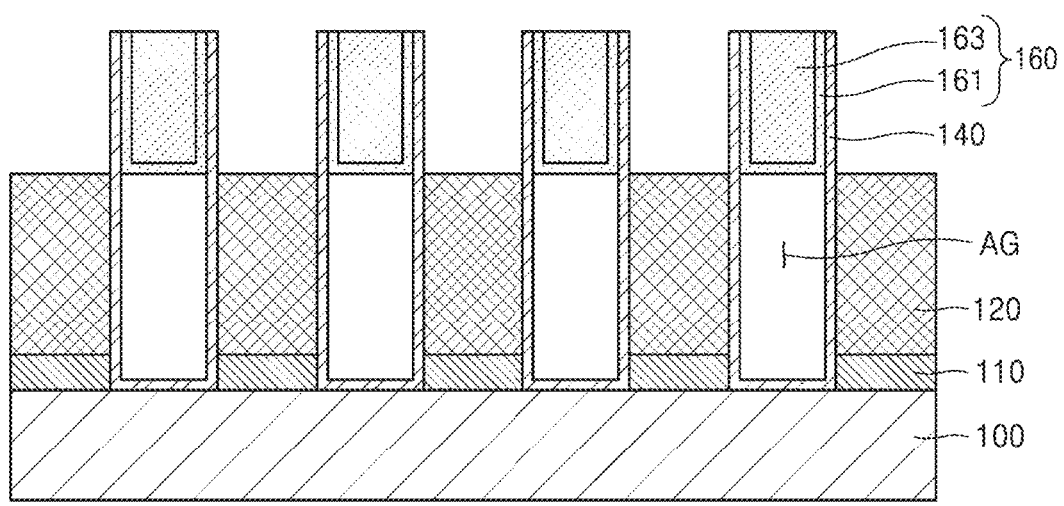

Referring to FIG. 6H, the second sacrificial layer 150 (see FIG. 6G) is entirely removed, and an air gap AG is formed in a location from which the second sacrificial layer 150 has been removed.

An etching process may vary according to a constituent material of the second sacrificial layer 150 (see FIG. 6G). For example, when the second sacrificial layer 150 (see FIG. 6G) is a carbon-containing layer, the second sacrificial layer 150 (see FIG. 6G) may be removed through an ashing process.

During a process of removing the second sacrificial layer 150 (see FIG. 6G), as a thickness proportion occupied by the second sacrificial layer 150 (see FIG. 6G) and a density of the constituent material thereof increase, influence of the removing process on other components may increase. Therefore, removal of the second sacrificial layer 150 (see FIG. 6G) may be performed under a condition in which influence of the removal on the lower wiring structure 120 and the insulating barrier layer 140 is suppressed.

Here, the capping layer 160 may include a material having a density that allows carbon (C) to pass through. This configuration is for providing a space through which carbon (C) that is a major material of the second sacrificial layer 150 (see FIG. 6G) may be smoothly discharged during the ashing process for removing the second sacrificial layer 150.

Figure 6I:
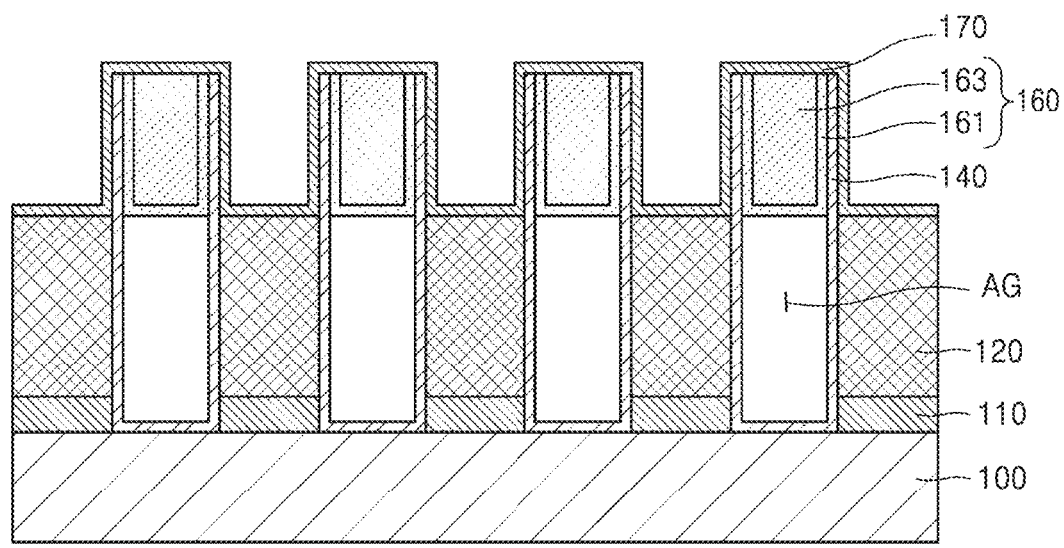

Referring to FIG. 6I, the etch stop layer 170 is formed to conformally cover the upper surface of the lower wiring structure 120, the insulating barrier layer 140, and the capping layer 160.

The etch stop layer 170 may be formed to have a protrusion and recess structure. That is, the etch stop layer 170 may form a protrusion and recess structure having the same phase as the protrusion and recess structure formed by the lower wiring structure 120 and the capping layer 160.

The material of the etch stop layer 170 may include a material including aluminum (Al), for example, aluminum oxide ($Al_xO_y$), aluminum nitride ($Al_xN_y$), aluminum oxynitride ($Al_xO_yN_z$), or any one selected from among zirconium oxide ($Zr_xO_y$) and hafnium oxide ($Hf_xO_y$). However, the material of the etch stop layer 170 is not limited thereto.

Figure 6J:
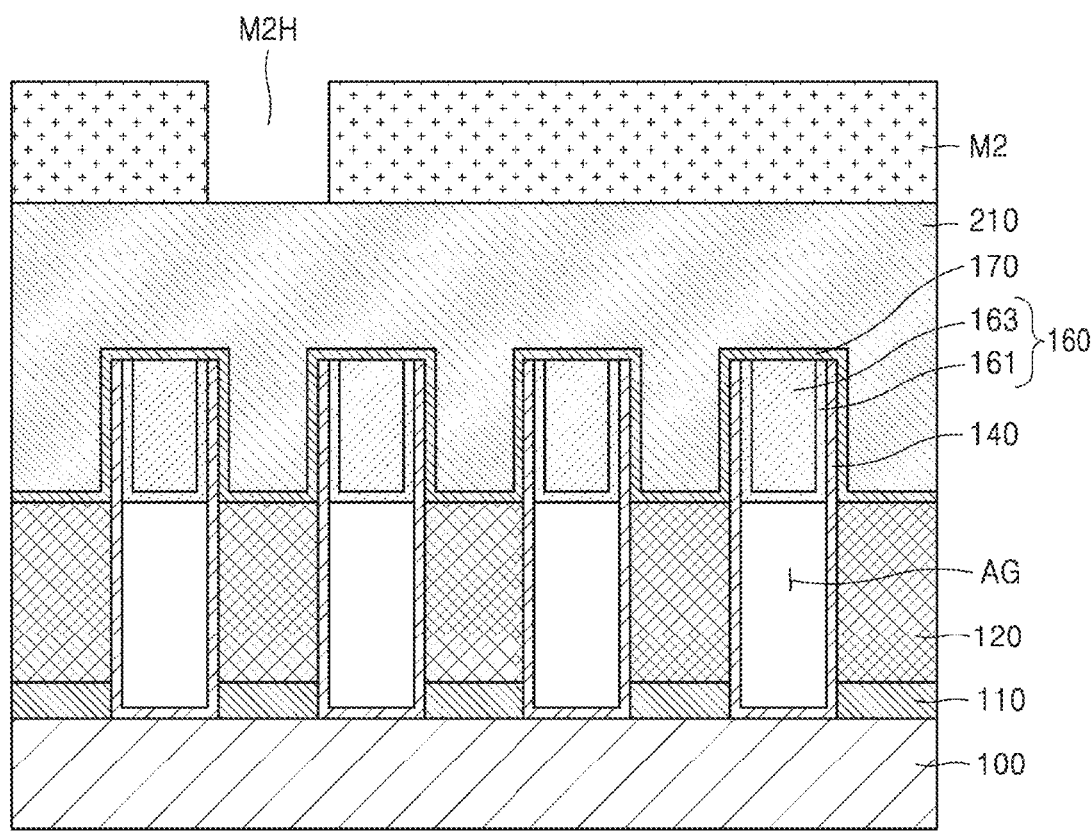

Referring to FIG. 6J, an insulating layer 210 is formed to cover the etch stop layer 170, and a second mask pattern M2 is formed on the insulating layer 210.

The insulating layer 210 is formed so that a lower surface thereof covers the upper surface of the etch stop layer 170. Therefore, the lower surface of the insulating layer 210 may form a protrusion and recess structure having an opposite phase to that of the protrusion and recess structure of the etch stop layer 170.

The second mask pattern M2 is formed on the insulating layer 210 through a lithography process. The second mask pattern M2 is formed by applying photoresist and patterning the photoresist through exposure and development. Here, when the upper wiring structure 220 (see FIG. 1A) is formed by the second mask pattern M2, a second open area M2H may be defined.

Figure 6K:
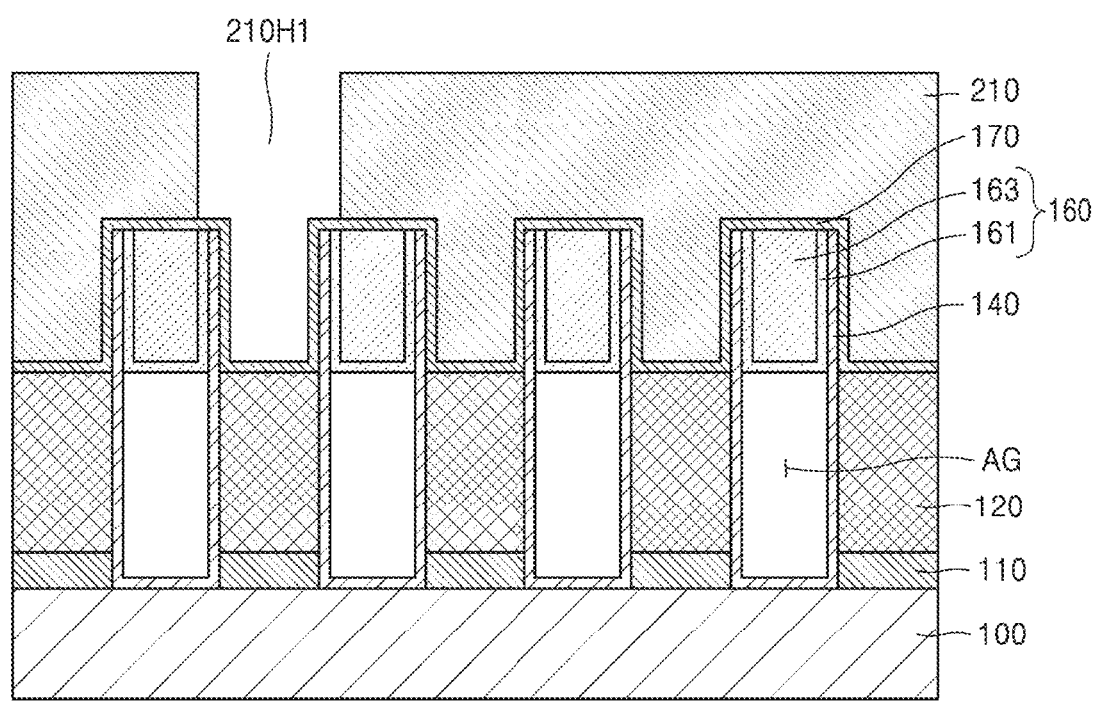

Referring to FIG. 6K, the insulating layer 210 is etched using the second mask pattern M2 as an etching mask.

The etch stop layer 170 is enabled to stop the etching process by adjusting an etching condition. Therefore, the etching process may be performed so that the upper surface of the etch stop layer 170 is exposed. That is, a first groove 210H1 may be formed in the insulating layer 210. The etching process for the insulating layer 210 may be a dry etching process.

Thereafter, the second mask pattern M2 may be removed using an ashing and strip process. The process of removing the second mask pattern M2 may be performed under a condition in which damage to the insulating layer 210 and the etch stop layer 170 is suppressed.

Figure 6L:
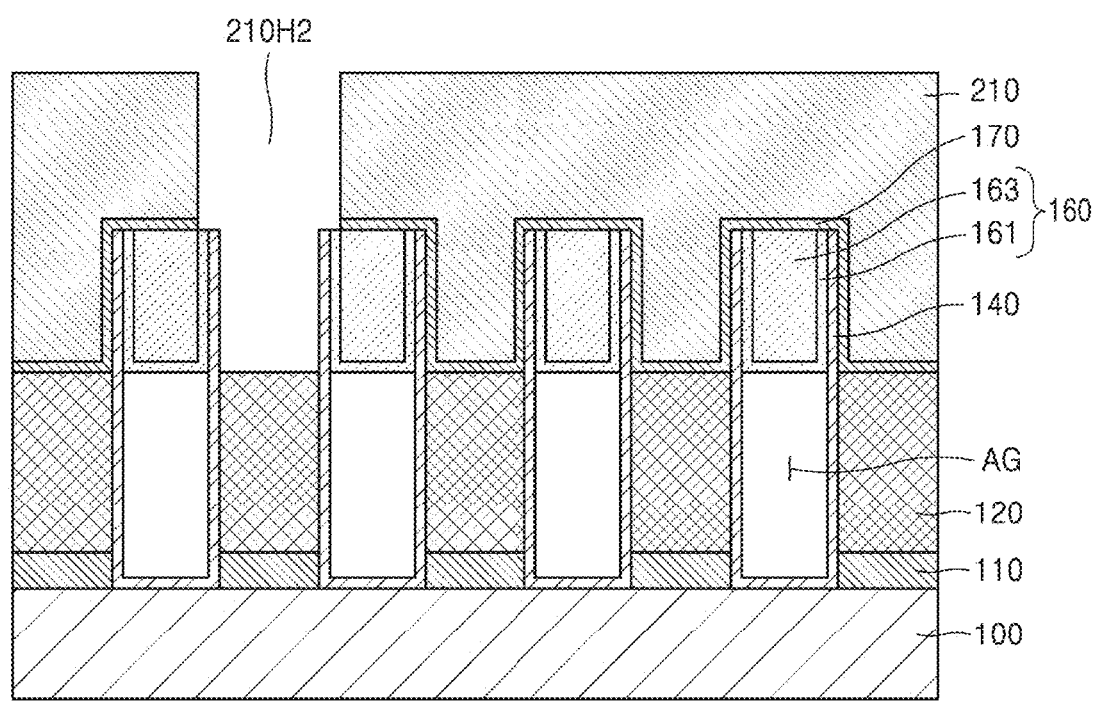

Referring to FIG. 6L, an exposed portion of the etch stop layer 170 is etched using the insulating layer 210 as an etching mask.

An etching condition may be adjusted so as to only etch the exposed portion of the etch stop layer 170 without etching the insulating layer 210, the insulating barrier layer 140, and the capping layer 160. Therefore, the etching process may be performed so that the upper surface of the insulating barrier layer 140 and a portion of the capping layer 160 are exposed. That is, a second groove 210H2 may be formed in the insulating layer 210. The etching process for the exposed portion of the etch stop layer 170 may be a wet etching process.

Referring back to FIG. 1A, the conductive barrier layer 221 is formed on an inner wall of the second groove 210H2, and the metal layer 223 filling the second groove 210H2 is formed on the conductive barrier layer 221.

The conductive barrier layer 221 may be conformally formed to cover the insulating layer 210, the insulating barrier layer 140, and the capping layer 160 exposed in the second groove 210H2. The metal layer 223 filling the second groove 210H2 is formed on the conductive barrier layer 221.

Thereafter, a resultant structure including the conductive barrier layer 221 and the metal layer 223 are polished through a chemical mechanical polishing process so that an upper surface of the insulating layer 210 is exposed so that the conductive barrier layer 221 and the metal layer 223 remain only in the second groove 210H2. As a result, the upper wiring structure 220, which fills the second groove 210H2 and is electrically connected to the lower wiring structure 120, may be formed.

The integrated circuit device 10 according to the inventive concepts may be manufactured through the above-mentioned manufacturing processes, and the integrated circuit device 10 may have improved electrical characteristics and reliability.

Figure 7:
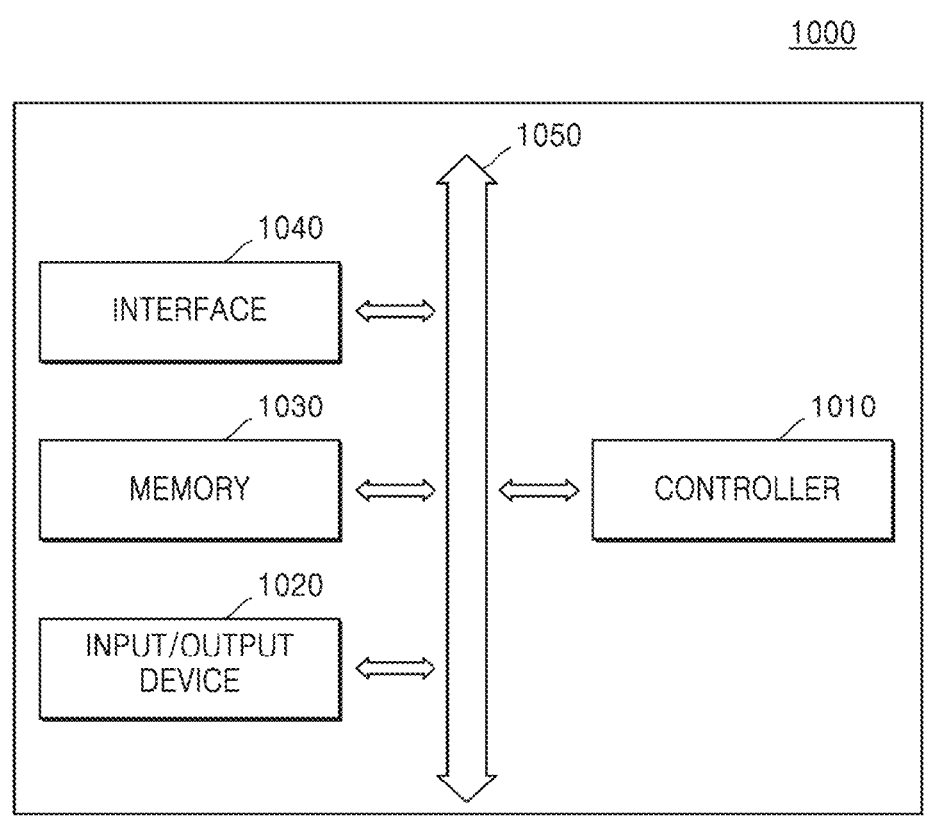
FIG. 7 is a configuration diagram illustrating a system of an integrated circuit device according to an embodiment of the inventive concepts.

FIG. 7 is a configuration diagram illustrating a system of an integrated circuit device according to an embodiment of the inventive concepts.

Referring to FIG. 7, a system 1000 includes a controller 1010, an input/output device 1020, a memory 1030, an interface 1040, and a bus 1050.

The system 1000 may be a mobile system or a system for transmitting or receiving information. In some embodiments, the mobile system may be a portable computer, a tablet, a mobile phone, a digital music player, a memory card, or the like.

The controller 1010, which controls a running program in the system 1000, may include a microprocessor, a digital signal processor, a microcontroller, or a similar device.

The controller 1010 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The input/output device 1020 may be used to input or output data of the system 1000. The system 1000 may be connected to an external device, such as a computer or a network through the input/output device 1020, and may exchange data with the external device. The input/output device 1020 may be, for example, a touchpad, a keyboard, a mouse, or a display.

The memory 1030 may store data for operating the controller 1010, or may store data processed by the controller 1010. The memory 1030 may include any one of the integrated circuit devices 10 to 40 according to the inventive concepts, described above with reference to FIGS. 1A to 4.

The interface 1040 may be a data transfer path between the system 1000 and an external device. The controller 1010, the input/output device 1020, the memory 1030, and the interface 1040 may communicate with each other via the bus 1050.

While the inventive concepts have been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
forming a lower wiring structure and a first sacrificial pattern on the lower wiring structure;
conformally forming an insulating barrier layer on the lower wiring structure and the first sacrificial pattern;
forming a second sacrificial pattern to fill a portion of an opening defined by the insulating barrier layer;
forming a capping layer on the second sacrificial pattern and the insulating barrier layer;
polishing the capping layer and the insulating barrier layer until an upper surface of the first sacrificial pattern is exposed;
removing the first sacrificial pattern;
forming an air gap by removing the second sacrificial pattern;
conformally forming an etch stop layer on the lower wiring structure, the insulating barrier layer, and the capping layer;
forming an insulating layer on the etch stop layer; and
forming an upper wiring structure penetrating the insulating layer.

2. The method of claim 1, wherein the lower wiring structure comprises:
a first lower wiring structure electrically connected to the upper wiring structure; and
a second lower wiring structure that is not electrically connected to the upper wiring structure.

3. The method of claim 2, wherein a shortest distance between the first lower wiring structure and the second lower wiring structure closest thereto is less than a shortest distance between a portion at which the upper wiring structure covers an upper surface of the capping layer and the second lower wiring structure closest thereto.

4. The method of claim 1, wherein the insulating barrier layer is formed to surround side and lower surfaces of the air gap,
wherein the insulating barrier layer and the capping layer are formed of different materials.

5. The method of claim 1, wherein the insulating barrier layer is formed to cover a side surface of the capping layer,
wherein the etch stop layer is formed to cover an upper surface of the capping layer and an upper surface of the insulating barrier layer.

6. The method of claim 1, wherein a width in a horizontal direction of the air gap is less than a thickness in a vertical direction of the capping layer.

7. The method of claim 1, wherein the insulating layer and the capping layer are formed of different materials, or formed of the same material having different densities.

8. The method of claim 1, wherein a lower surface of the insulating layer is formed in a concave-convex structure having a phase opposite to a concave-convex structure of the etch stop layer.

9. The method of claim 1, wherein a level of an upper surface of the lower wiring structure is formed to be higher than a level of an upper surface of the air gap,
wherein a level of the upper surface of the lower wiring structure is formed to be higher than a level of a lower surface of a capping layer.

10. The method of claim 1, wherein a level of an upper surface of the lower wiring structure is formed to be lower than a level of an upper surface of the air gap,
wherein a level of the upper surface of the lower wiring structure is formed to be lower than a level of a lower surface of the capping layer.

11. A method of manufacturing an integrated circuit device, the method comprising:
forming lower wiring structures, on an upper surface of a substrate, the lower wiring structures spaced apart from each other in a first direction, extending in a second direction orthogonal to the first direction, and having a same height in a third direction perpendicular to the upper surface of the substrate;
forming an insulating barrier layer conformally covering the upper surface of the substrate and the lower wiring structures;
forming a sacrificial pattern having a different first or second width in the first direction between the lower wiring structures;
forming a capping layer covering an upper surface of the sacrificial pattern and having the first width or the second width with the same width as the corresponding sacrificial pattern;
forming an air gap by removing the sacrificial pattern;
forming an etch stop layer conformally covering an upper surface of each of the lower wiring structures, a side surface of the insulating barrier layer, an upper surface of the insulating barrier layer, and an upper surface of the capping layer;
forming an insulating layer covering the etch stop layer; and
forming an upper wiring structure penetrating the insulating layer and connected to an upper surface of the lower wiring structures that is not covered by the etch stop layer,
wherein the first width of the air gap is less than a thickness of the capping layer in the third direction.

12. The method of claim 11, wherein a level of the upper surface of the capping layer is formed to be higher than a level of the upper surface of each of the lower wiring structures.

13. The method of claim 11, wherein a lower surface of the insulating layer is formed as a concave-convex structure that conformally covers an upper surface of the etch stop layer.

14. The method of claim 11, wherein a portion of the upper wiring structure is formed to contact the capping layer and the insulating barrier layer.

15. The method of claim 11, wherein the lower wiring structures are formed as a first layer metal wiring,
wherein the upper wiring structure is formed as a vertical via connected to the first layer metal wiring.

16. A method of manufacturing an integrated circuit device, the method comprising:
forming a first lower wiring structure and a second lower wiring structure formed on a substrate;
forming an insulating barrier layer conformally covering an upper surface of the substrate and the first and second lower wiring structures;
forming a sacrificial pattern between the first and second lower wiring structures;
forming a capping layer covering an upper surface of the sacrificial pattern and having a width equal to that of the sacrificial pattern;
forming an air gap by removing the sacrificial pattern;
forming an etch stop layer conformally covering an upper surface of the second lower wiring structure, a side surface of the insulating barrier layer, an upper surface of the insulating barrier layer, and an upper surface of the capping layer;

forming an insulating layer covering the etch stop layer; and forming an upper wiring structure penetrating the insulating layer, connected to an upper surface of the first lower wiring structure, and having a protruding portion covering a portion of an upper surface of the capping layer, wherein a shortest distance between the first lower wiring structure and the second lower wiring structure closest thereto is less than a shortest distance between the protruding portion and the second lower wiring structure closest to the protruding portion.

17. The method of claim 16, wherein the etch stop layer is formed as a concave-convex structure, wherein the etch stop layer is formed of an insulating material containing aluminum (Al).

18. The method of claim 16, wherein a level of an upper surface of the capping layer is formed to be higher than a level of an upper surface of the second lower wiring structure.

19. The method of claim 16, wherein the air gap is formed to be spaced apart from the first and second lower wiring structures by sealing with different insulating materials.

20. The method of claim 16, wherein the capping layer comprises:

a first capping layer conformally covering a portion of a side surface of the insulating barrier layer and an upper surface of the air gap; and a second capping layer filling the first capping layer and having a material different from that of the first capping layer.

* * * * *